(12) United States Patent
Beierschmitt

(10) Patent No.: US 11,385,299 B2
(45) Date of Patent: Jul. 12, 2022

(54) MULTIPLE ARC FAULT/GROUND FAULT SIGNAL PATH

(71) Applicant: Schneider Electric USA, Inc., Andover, MA (US)

(72) Inventor: Joseph R. Beierschmitt, Marion, IA (US)

(73) Assignee: Schneider Electric USA, Inc., Boston, MA (US)

( * ) Notice: Subject to any disclaimer, the term of this patent is extended or adjusted under 35 U.S.C. 154(b) by 307 days.

(21) Appl. No.: 16/702,731

(22) Filed: Dec. 4, 2019

(65) Prior Publication Data
US 2021/0173015 A1 Jun. 10, 2021

(51) Int. Cl.
*G01R 31/52* (2020.01)
*H01H 33/26* (2006.01)
*H02H 1/00* (2006.01)

(52) U.S. Cl.
CPC ............. *G01R 31/52* (2020.01); *H01H 33/26* (2013.01); *H02H 1/0015* (2013.01)

(58) Field of Classification Search
CPC ...... G01R 31/52; G01R 31/083; H01H 33/26; H01H 71/125; H01H 71/123; H02H 1/0015
USPC ........................................ 324/500, 509, 512
See application file for complete search history.

(56) References Cited

U.S. PATENT DOCUMENTS

| | | | |
|---|---|---|---|
| 6,538,863 B1 | 3/2003 | Macbeth | |
| 9,007,068 B2 * | 4/2015 | Pushkolli | G01R 31/007 324/522 |
| 10,333,290 B2 | 6/2019 | Beierschmitt | |
| 11,204,396 B2 * | 12/2021 | Bhalwankar | H02H 7/1216 |
| 2016/0091556 A1 * | 3/2016 | Chen | G01R 31/34 324/762.07 |
| 2016/0103157 A1 * | 4/2016 | Kinsella | H01F 38/30 361/31 |
| 2022/0014013 A1 * | 1/2022 | Zhong | H02M 1/0009 |
| 2022/0050146 A1 * | 2/2022 | Leroy | G01R 19/165 |

* cited by examiner

*Primary Examiner* — Giovanni Astacio-Oquendo
(74) *Attorney, Agent, or Firm* — Locke Lord LLP

(57) ABSTRACT

A system and method are provided to detect a fault on a circuit. A current sensor is provided for sensing current on at least one line conductor and/or a neutral conductor on a circuit, and a switch is operated between at least first and second positions to selectively control a signal pathway on the at least one line conductor or the neutral conductor in relations to the sensor. The sensor performs a first current measurement corresponding to current across one conductor from the at least one line conductor and the neutral conductor in the first position, and a second current measurement corresponding to a current balance or imbalance between the conductors in the second position. The current sensor outputs the first current measurement for detecting an arc fault in the first position, or the second current measurement for detecting a ground fault in the second position.

17 Claims, 3 Drawing Sheets

MULTIPLE ARC FAULT/GROUND FAULT SIGNAL PATH

TECHNICAL FIELD

The present disclosure relates to a fault detection method and system, and more particularly, to a method and system for performing arc and ground fault detection on a circuit using the same sensor.

BACKGROUND

Electrical systems in residential, commercial and industrial applications can include a panelboard for receiving electrical power from a utility source. The power may be routed through protection devices to designated branch circuits which supply electrical power to one or more loads. These protection devices, for example, circuit interrupters such as circuit breakers, can be configured to interrupt current flow on the circuit(s) if certain limits of the conductors supplying the loads are surpassed. These limits can result from an arc fault, ground fault or other conditions which may pose risk of injury or the potential of property damage. Different sensor systems are generally employed for arc fault detection and for ground fault detection.

SUMMARY

In accordance with an embodiment, a system and method are provided to detect a fault on a circuit. The system and method involve providing a current sensor for sensing current on at least one line conductor and/or a neutral conductor on a circuit, and operating a switch between at least first and second positions to selectively control a signal pathway on the at least one line conductor or the neutral conductor in relations to the current sensor. The signal pathway can include a parallel circuit path to circumvent the current sensor for the at least one line conductor or the neutral conductor when the switch is in the first position. The current sensor performs a first current measurement corresponding to current across one conductor from the at least one line conductor and the neutral conductor when the switch is in the first position. The current sensor performs a second current measurement corresponding to a current balance or imbalance between the at least one line conductor and the neutral conductor when the switch is in the second position. The system and method further involve outputting from the current sensor the first current measurement for detecting a presence or absence of an arc fault when the switch is in the first position, or the second current measurement for detecting a presence or absence of a ground fault when the switch is in the second position. In various embodiments, the current sensor can be a single current transformer.

In various embodiments, the system and method can further involve controlling a circuit interrupter to interrupt current flow on the circuit when an arc fault or ground fault is detected. The system and method can detect a presence or absence of an arc fault based on the outputted first current measurement, and can detect a presence or absence of a ground fault based on the outputted second current measurement. The system and method can determine a presence of a ground fault when current imbalance exists between the at least one line conductor and the neutral conductor as reflected by the outputted second current measurement.

The system and method can further involve controlling a timing of the switching operation between first and second positions according to a predefined schedule. The at least one line conductor can include a plurality of line conductors for a multi-phase power supply.

BRIEF DESCRIPTION OF THE DRAWINGS

A more detailed description of the disclosure, briefly summarized above, may be had by reference to various embodiments, some of which are illustrated in the appended drawings. While the appended drawings illustrate select embodiments of this disclosure, these drawings are not to be considered limiting of its scope, for the disclosure may admit to other equally effective embodiments.

Identical reference numerals have been used, where possible, to designate identical elements that are common to the figures. However, elements disclosed in one embodiment may be beneficially utilized on other embodiments without specific recitation.

DETAILED DESCRIPTION

The present disclosure is directed to a fault detection method and system, which can selectively measure current on a single conductor from a line conductor(s) or a neutral conductor of a power supply line(s) or a current balance or imbalance across the line and neutral conductors using the same sensor in order to detect a presence or absence of arc fault or ground fault, respectively. The method and system can control a signal pathway of the line or neutral conductor to divert current flow on the conductor in relations to the sensor using a switch (or switching circuitry). The signal pathway can include a parallel circuit path which can be used to circumvent the sensor. By controlling the signal pathway using a switch, it is possible to measure current on a single conductor for performing arc fault detection or measure current balance or imbalance across multiple conductors for performing ground fault detection, using the same sensor. The switch can be operated according to a predefined timing schedule or in response to a command (e.g., automated command from a remote device or a manual user command initiated through a local or remote user input device) to perform operations either for arc fault detection or ground fault detection. In various embodiments, the sensor can be a current sensor such as a current transformer with one or more windings. A more detailed explanation of various examples of the fault detection method and system will be described below with respect to the figures. The fault detection system can be incorporated into a circuit protective device, such as a circuit breaker, or other devices or systems which perform arc fault and/or ground fault detection.

Figure 1:
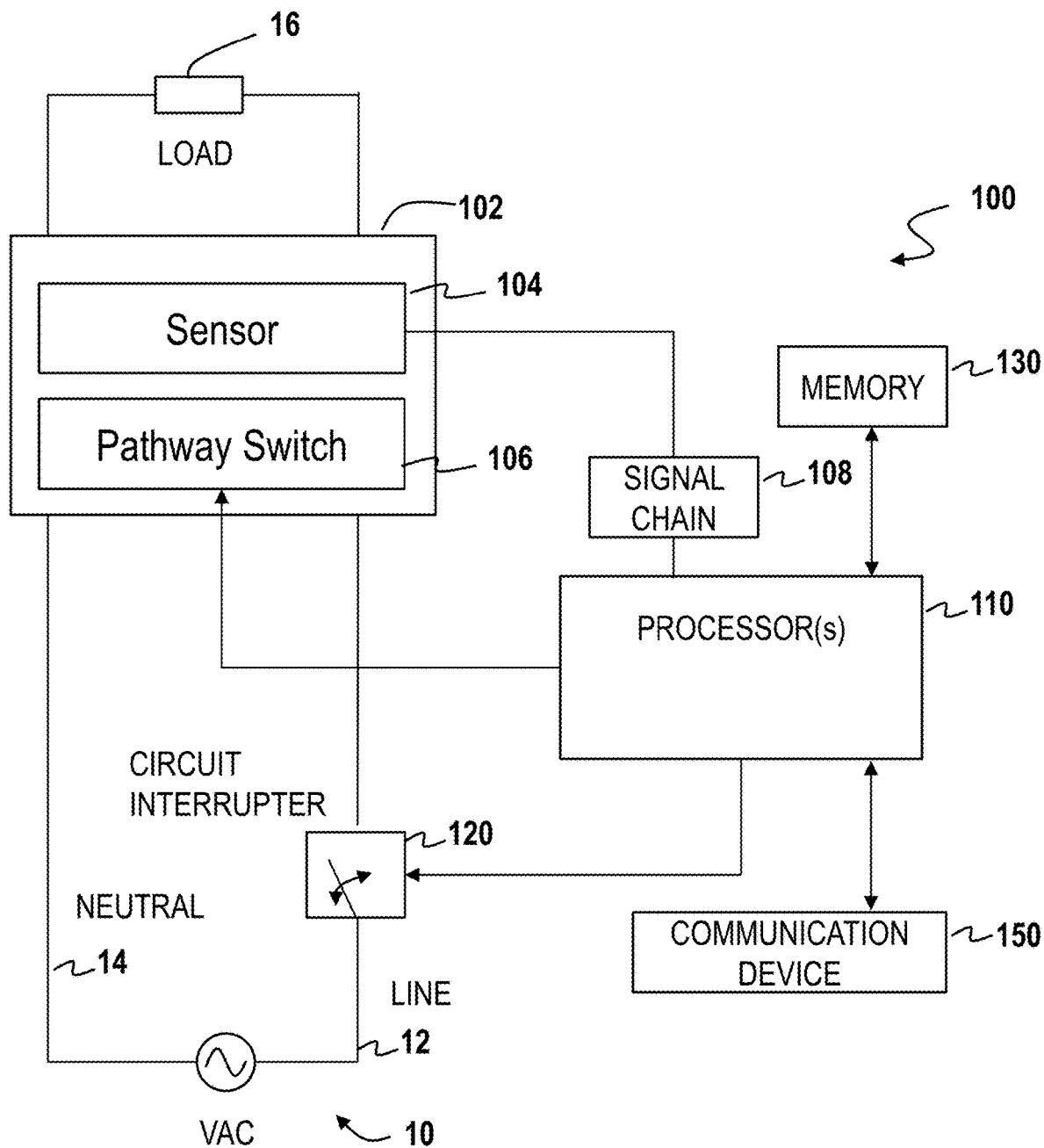
FIG. 1 is a block diagram illustrating an example fault detection system for selectively performing arc fault detection or ground fault detection on a circuit.

FIG. 1 illustrates a block diagram of an exemplary fault detection device 100. As shown in FIG. 1, the fault detection device 100 monitors the electrical characteristics on an AC circuit 10, and interrupts current to the circuit 10 via a circuit interrupter 120 in response to a detection of a fault tripping event, such as an arc fault or a ground fault. The circuit 10 includes one or more line conductors 12, a neutral conductor 14 and a load 16. The load across the circuit 10 may vary depending on what devices are connected to the circuit 10. The circuit interrupter 120, such as the separable contacts of a breaker, can include a trip solenoid and a latch or other circuit interrupting mechanism to interrupt current flow (or power) on the circuit 10. The fault detection device 100 can be incorporated into (or used in conjunction with) a circuit protective device, such as a circuit breaker, or other devices or systems which perform arc fault and/or ground fault detection.

The fault detection device 100 can include a sensor system 102, a signal chain 108, one or more processors 110, memory 130 and a communication device 150 for conducting wireless or wireline communication with a remote device or system (e.g., computer system such as a management monitoring or control system, user device, etc.). The fault detection device 100 may draw power from the circuit 10 and employ a backup power source, such as a battery (not shown).

The sensor system 102 can include a sensor 104 and a pathway switch 106. The sensor 104 can monitor or sense electrical characteristics, e.g., current, of the circuit 10 and the load 16 such as across the line conductor(s) 12 and/or the neutral conductor 14, and can output signals corresponding to current measurements. In various embodiments, the sensor can be a current sensor such as for example a current transformer (CT), which can include one or more windings. The pathway switch 106 can be operated to divert current flow on a portion of the line conductor(s) 12 or the neutral conductor 14 to a different circuit path(s) (not shown) in relations to the sensor 104. For example, the different circuit path(s) may be a parallel circuit path around the portion of the line conductor(s) or the neutral conductor used by the sensor 104 to conduct measurements of electrical characteristics such as current.

The output of the sensor 104 may also be connected to the signal chain 108, which can include components for implementing signal processing on the signal(s) outputted by the sensor. The signal chain 108 can, for example, include signal conditioning circuitry, gain or amplification circuitry, threshold detectors, filters (e.g., bandpass filters), analog-to digital converters and/or other signal processing components for processing the signal from the sensor 104 prior to output to the processor 110. In various embodiments, the signal chain 108 can also include a plurality of different signal chains to process the signal output from the sensor 104 when performing arc fault detection versus ground fault detection, and a signal processing switch (or the like) to select the desired signal chain to utilize according to the type of fault detection to be performed. For example, different gain or application circuitry and signal filters may be applied to the signal from the sensor 104 depending on the type of fault detection to be performed.

As further shown in FIG. 1, the processor 110 is in communication with the memory 130. The processor 110 is a data processing system, such as a microcontroller(s), a microprocessor(s) or data processing circuit, which is configured to control the operations of the fault detection device 100 and its components in order to implement the fault detection and circuit interruption operations, such as described herein. For example, the processor 110 can control the pathway switch 106 so that the sensor 104 performs a first signal measurement (e.g., current measurement) corresponding to current on a single conductor such as a line or neutral conductor for arc fault detection, or performs a second signal measurement (e.g., current imbalance) across multiple conductors such as the line and neutral conductors for ground fault detection. The processor 110 can also control the signal processing switch in the signal chain 108 to select a desired signal chain to process the output signal from the sensor 104 according to the type of fault detection to be performed. The processor 110 can also evaluate the first signal measurement from the sensor 104 to detect for (or determine) the presence or absence of an arc fault on the circuit, or evaluate the second signal measurement from the sensor 104 to detect for the presence of absence of a ground fault on the circuit. When an arc or ground fault is detected on the circuit 10, the processor 110 can further control the circuit interrupter 120 to interrupt current flow on the circuit 10, and perform other related tasks including but not limited to reporting the fault detection to a remote device or system via the communication device 150, updating a history (stored in the memory 130) to reflect the fault event and so forth.

The memory 130 can store computer executable code or programs, which when executed by the processor 110, controls the operations of the fault detection device 100, such as described herein. The memory 130 can also store parameters for operating the fault detection system 100 and identifying fault conditions, such as thresholds or conditions of electrical characteristics (e.g., current, voltage, etc.), fault models/patterns and/or other parameters used for arc fault and/or ground fault detection. The memory 130 can also store timing parameters for controlling the pathway switch 106 to perform arc fault detection or ground fault detection, while supplying current (or power) on the circuit 10. The timing parameters can include predetermined schedule for operating the switch 106, or conditions under which the switch 106 is to be operated for arc fault detection or ground fault detection.

Figure 2:
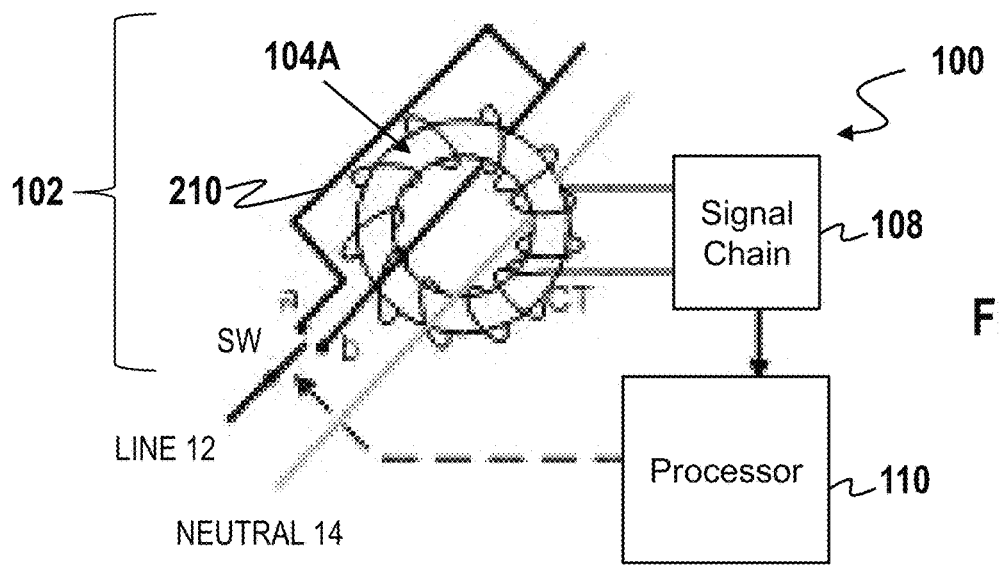
FIG. 2 is diagram illustrating an example fault detection system, with a switch for controlling a signal pathway of a line or neutral conductor, in accordance with an embodiment.

FIG. 2 is diagram illustrating an example of the fault detection system 100, in accordance with an embodiment. As shown in the example of FIG. 2, the sensor system 102 can include a sensor 104A such as a current transformer, a pathway switch SW, and a circuit path 210 to divert current flow from a conductor such as the line conductor 12 (or the neutral conductor 14). In this example, the circuit path 210 can be a parallel circuit path to divert current flow from a portion of the line conductor 12, which passes through the sensor 104A.

Figure 3:
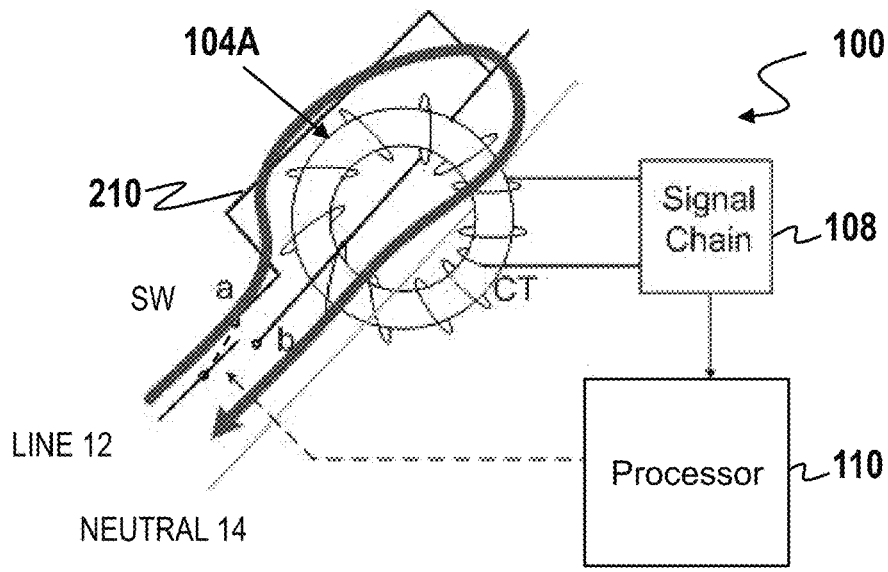
FIG. 3 is diagram illustrating an example fault detection system of FIG. 2 with the switch in a position for performing arc fault detection, in accordance with an embodiment.

As shown in FIG. 3, in operation, the processor 110 can control the switch SW to a first position (e.g., position a) to divert all of the current on the line conductor 12 around the sensor 104A. In the first position, the current on the line conductor 12 is shown as flowing around (or bypassing) the sensor 104A, with the return current on the neutral conductor 14 flowing through the sensor 104A. The sensor 104A can then measure the current on one of the conductors, such as the neutral conductor 14 in this example, and output a first current measurement to the processor 110 for performing arc fault detection. The processor 110 can evaluate the first current measurement to detect a presence or absence of an arc fault, such as by performing comparisons of the first measurement(s) against threshold(s) and/or arc fault model(s) or by using well-known arc fault detection techniques.

Figure 4:
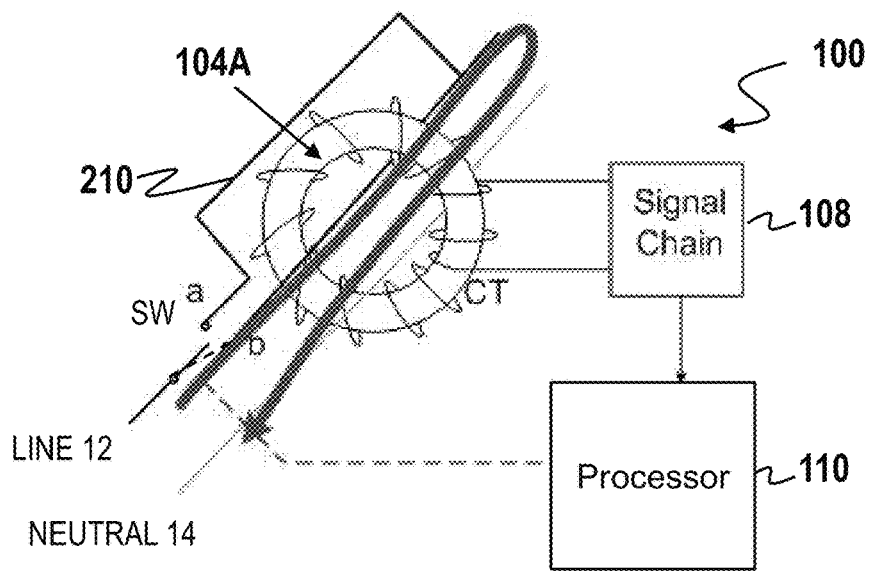
FIG. 4 is diagram illustrating an example fault detection system of FIG. 2 with the switch in a position for performing ground fault detection, in accordance with an embodiment.

As shown in FIG. 4, the processor 110 can also control the switch SW to a second position (e.g., position b) in which the current continues to flow through the portion of the line conductor 12, which passes through the sensor 104A. In the second position, the current on the line conductor 12 is shown as flowing through the sensor 104A, with the return current on the neutral conductor 14 also flowing through the sensor 104A. The sensor 104A can then measure current representing a current balance or imbalance between the conductors, such as the line conductor 12 and the neutral conductor 14 in this example, and output a second current measurement to the processor 110 for performing ground fault detection. The processor 110 can evaluate the second current measurement corresponding to a current balance or imbalance between the conductors, and detect a presence of a ground fault when the second current measurement reflects a current imbalance between the line and neutral conductors 12, 14.

Although the parallel circuit path 210 is connected to divert current flow from a portion of the line conductor 12 in the example of FIGS. 2-4, it should be understood that the circuit path 210 can instead be connected to divert current flow from a portion of the neutral conductor 14, which passes through the sensor 104A. Furthermore, the sensor system 104A can be employed with multi-phase power supply systems that have a plurality of line conductors, where multiple switches SW can be employed to divert current flow through the line conductors in the first position for performing arc fault detection.

Figure 5:
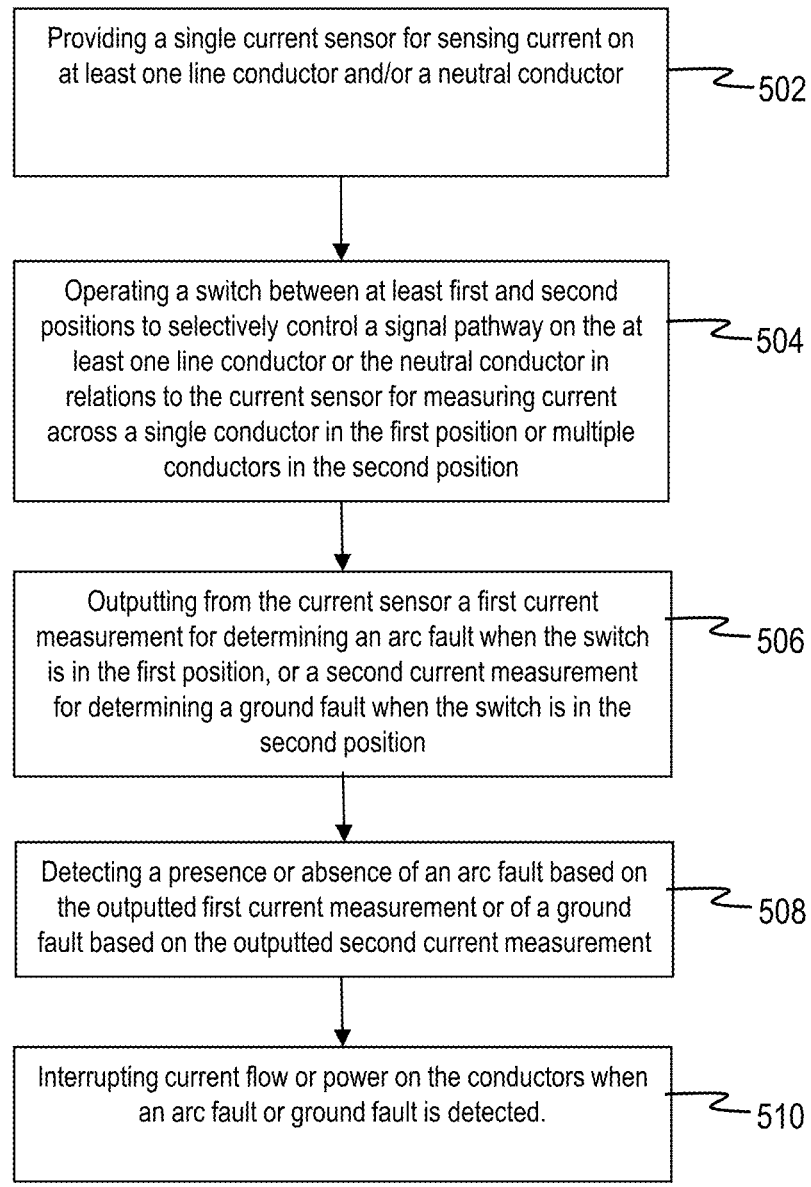
FIG. 5 is an example process by which to selectively perform arc fault detection or ground fault detection using the same sensor, in accordance with an embodiment.

FIG. 5 is an example process 500 by which to selectively perform arc fault detection or ground fault detection using the same sensor, in accordance with an embodiment. By way of explanation, the process 500 can be implemented through the components of the fault detection system 100 under control of the processor(s) 110.

At reference 502, a sensor, such as a current sensor, is provided for sensing current on at least one line conductor and/or a neutral conductor on a circuit. The current sensor can be a current transformer with one or more windings.

At reference 504, a switch is operated between at least first and second positions to selectively control a signal pathway on the at least one line conductor or the neutral conductor in relations to the current sensor for measuring current across a single conductor in the first position or multiple conductors in the second position. As previously discussed, the signal pathway can include a parallel circuit path which can divert current flow from a portion of the at least one line conductor or the neutral conductor passing through the current sensor.

At reference 506, the current sensor outputs a first current measurement for detecting a presence or absence of an arc fault when the switch is in the first position, or a second current measurement for detecting a presence or absence of a ground fault when the switch is in the second position. The first current measurement corresponds to current across one conductor, such as either the line conductor or the neutral conductor. The second current measurement corresponds to current balance or imbalance across multiple conductors, such as the line conductor and the neutral conductor.

At reference 508, a presence or absence of an arc fault is detected based on the outputted first current measurement, or a presence or absence of a ground fault is detected based on the outputted second current measurement.

At reference 510, current flow (or power) is interrupted on the conductors of the circuit when an arc fault or ground fault is detected. For example, a circuit interrupter on the circuit is tripped to interrupt the flow of current on the conductors of the circuit.

In the preceding, reference is made to various embodiments. However, the scope of the present disclosure is not limited to the specific described embodiments. Instead, any combination of the described features and elements, whether related to different embodiments or not, is contemplated to implement and practice contemplated embodiments. Furthermore, although embodiments may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

The various embodiments disclosed herein may be implemented as a system, method or computer program product. Accordingly, aspects may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects may take the form of a computer program product embodied in one or more computer-readable medium(s) having computer-readable program code embodied thereon.

Any combination of one or more computer-readable medium(s) may be utilized. The computer-readable medium may be a non-transitory computer-readable medium. A non-transitory computer-readable medium may be, for example, but not limited to, an electronic, magnetic, optical, electromagnetic, infrared, or semiconductor system, apparatus, or device, or any suitable combination of the foregoing. More specific examples (a non-exhaustive list) of the non-transitory computer-readable medium can include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. Program code embodied on a computer-readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages. Moreover, such computer program code can execute using a single computer system or by multiple computer systems communicating with one another (e.g., using a local area network (LAN), wide area network (WAN), the Internet, etc.). While various features in the preceding are described with reference to flowchart illustrations and/or block diagrams, a person of ordinary skill in the art will understand that each block of the flowchart illustrations and/or block diagrams, as well as combinations of blocks in the flowchart illustrations and/or block diagrams, can be implemented by computer logic (e.g., computer program instructions, hardware logic, a combination of the two, etc.). Generally, computer program instructions may be provided to a processor(s) of a general-purpose computer, special-purpose computer, or other programmable data processing apparatus. Moreover, the execution of such computer program instructions using the processor(s) produces a machine that can carry out a function(s) or act(s) specified in the flowchart and/or block diagram block or blocks.

The flowchart and block diagrams in the Figures illustrate the architecture, functionality and/or operation of possible implementations of various embodiments of the present disclosure. In this regard, each block in the flowchart or block diagrams may represent a module, segment or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It is to be understood that the above description is intended to be illustrative, and not restrictive. Many other implementation examples are apparent upon reading and understanding the above description. Although the disclosure describes specific examples, it is recognized that the systems and methods of the disclosure are not limited to the examples described herein, but may be practiced with modifications within the scope of the appended claims. Accordingly, the specification and drawings are to be regarded in an illustrative sense rather than a restrictive sense. The scope of the disclosure should, therefore, be determined with reference to the appended claims, along with the full scope of equivalents to which such claims are entitled.

I claim:

1. A method of detecting a fault on a circuit, comprising:
providing a current sensor for sensing current on at least one line conductor, a neutral conductor, or both the at least one line conductor and the neutral conductor on the circuit;
operating a switch between at least first and second positions to selectively control a signal pathway on the at least one line conductor or the neutral conductor in relations to the current sensor, the signal pathway including a parallel circuit path to circumvent the current sensor for the at least one line conductor or the neutral conductor when the switch is in the first position, the current sensor performing a first current measurement corresponding to current across one conductor from the at least one line conductor and the neutral conductor when the switch is in the first position and performing a second current measurement corresponding to a current balance or imbalance between the at least one line conductor and the neutral conductor when the switch is in the second position; and
outputting from the current sensor the first current measurement for detecting a presence or absence of an arc fault when the switch is in the first position, or the second current measurement for detecting a presence or absence of a ground fault when the switch is in the second position.

2. The method of claim 1, wherein the current sensor comprises a single current transformer.

3. The method of claim 1, further comprising:
controlling a circuit interrupter to interrupt current flow on the circuit when the arc fault or ground fault is detected.

4. The method of claim 1, further comprising:
detecting a presence or absence of the arc fault based on the outputted first current measurement.

5. The method of claim 4, wherein a presence of the ground fault is determined when current imbalance exists between the at least one line conductor and the neutral conductor as reflected by the outputted second current measurement.

6. The method of claim 1, further comprising:
detecting a presence or absence of the ground fault based on the outputted second current measurement.

7. The method of claim 1, further comprising:
controlling a timing of the switching operation between first and second positions according to a predefined schedule.

8. The method of claim 1, wherein the at least one line conductor comprises a plurality of line conductors for a multi-phase power supply.

9. A system for detecting a fault on a circuit, comprising:
a current sensor to sense current on at least one line conductor, a neutral conductor, or both the at least one line conductor and the neutral conductor on the circuit;
a switch configured to operate between at least first and second positions to control a signal pathway of the at least one line conductor or the neutral conductor in relations to the current sensor, the signal pathway including a parallel circuit path to circumvent the current sensor for the at least one line conductor or the neutral conductor when the switch is in the first position; and
one or more processors configured to control the operation of the switch between the at least first and second positions to control a current pathway of the at least one line conductor or the neutral conductor in relations to the current sensor, the current sensor performing a first current measurement corresponding to current across one conductor from the at least one line conductor and the neutral conductor when the switch is in the first position and performing a second current measurement corresponding to current balance or imbalance across the at least one line conductor and the neutral conductor when the switch is in the second position,
wherein the current sensor outputs the first current measurement for detecting a presence or absence of an arc fault when the switch is in the first position, or the second current measurement for detecting a presence or absence of a ground fault when the switch is in the second position.

10. The system of claim 9, wherein the current sensor comprises a single current transformer.

11. The system of claim 9, wherein the one or more processors are further configured to control a circuit interrupter to interrupt current flow on the circuit when the arc fault or ground fault is detected.

12. The system of claim 9, wherein the one or more processors are further configured to detect a presence or absence of the arc fault based on the outputted first current measurement.

13. The system of claim 9, wherein the one or more processors are further configured to detect a presence or absence of the ground fault based on the outputted second current measurement.

14. The system of claim 13, wherein the one or more processors are configured to determine a presence of the ground fault when current imbalance exists between the at least one line conductor and the neutral conductor as reflected by the outputted second current measurement.

15. The system of claim 9, wherein the one or more processors are further configured to control a timing of the switching operation between first and second positions according to a predefined schedule.

16. The system of claim 9, wherein the at least one line conductor comprises a plurality of line conductors for a multi-phase power supply.

17. A non-transitory computer readable medium storing computer executable code, which when executed by one or more processors, is configured to implement a method of detecting a fault on a circuit, the method comprising:

controlling operation of a switch between at least first and second positions to selectively control a signal pathway on at least one line conductor or a neutral conductor on the circuit in relations to a current sensor for sensing current on the at least one line conductor, the neutral conductor, or both the at least one line conductor and the neutral conductor on the circuit, the current sensor performing a first current measurement corresponding to current across one conductor from the at least one line conductor and the neutral conductor when the switch is in the first position and performing a second current measurement corresponding to a current balance or imbalance between the at least one line conductor and the neutral conductor when the switch is in the second position, the signal pathway including a parallel circuit path to circumvent the current sensor for the at least one line conductor or the neutral conductor when the switch is in the first position; and obtaining from the current sensor the first current measurement for detecting a presence or absence of an arc fault when the switch is in the first position, or the second current measurement for detecting a presence or absence of a ground fault when the switch is in the second position.

* * * * *